US006028983A

United States Patent [19]

Jaber

[11] Patent Number: 6,028,983

[45] Date of Patent: Feb. 22, 2000

[54] APPARATUS AND METHODS FOR TESTING A MICROPROCESSOR CHIP USING DEDICATED SCAN STRINGS

[75] Inventor: Talal Kamel Jaber, Austin, Tex.

[73] Assignee: International Business Machines Corporation, Armonk, N.Y.

[21] Appl. No.: 08/715,728

[22] Filed: Sep. 19, 1996

[51] Int. Cl.[7] .......................... G06F 11/00; G01R 31/318

[52] U.S. Cl. .................................... 395/183.06; 371/22.31

[58] Field of Search ......................... 395/183.06, 183.03, 395/183.08; 371/22.3, 22.31, 22.32, 22.33, 22.34, 22.35, 22.36

[56] References Cited

U.S. PATENT DOCUMENTS

| | | | |
|---|---|---|---|
| 4,503,537 | 3/1985 | McAnney | 371/25 |
| 4,597,042 | 6/1986 | d'Angeac et al. | 364/200 |
| 4,872,169 | 10/1989 | Whetzel, Jr. | 371/22.3 |
| 4,897,837 | 1/1990 | Ishihara et al. | 371/22.3 |
| 5,048,021 | 9/1991 | Jarwala et al. | 371/22.3 |
| 5,233,612 | 8/1993 | Huyskens et al. | 371/16.2 |
| 5,241,265 | 8/1993 | McDonnell et al. | 371/22.31 |
| 5,253,255 | 10/1993 | Carbine | 371/22.6 |
| 5,271,019 | 12/1993 | Edwards et al. | 371/22.3 |
| 5,325,368 | 6/1994 | James et al. | 371/22.3 |
| 5,442,644 | 8/1995 | Heflin | 395/184.01 |
| 5,491,666 | 2/1996 | Sturges | 365/201 |
| 5,495,487 | 2/1996 | Whetzel, Jr. | 371/25.1 |
| 5,515,505 | 5/1996 | Ishizuka | 395/183.06 |

OTHER PUBLICATIONS

Bleeker et al., "Boundary Scan Test, a Practical Approach", 1993, pp. 78–81.

*Primary Examiner*—Joseph Palys
*Attorney, Agent, or Firm*—Morgan & Finnegan, LLP; Joseph C. Redmond, Jr.

[57] ABSTRACT

A test apparatus and method for design verification of at least one microprocessor chip includes a compatible Joint Task Action Group (JTAG) terminal for access to a plurality of computer functional units contained in the chip. A test input terminal included in the JTAG terminal receives a scan string, the string being coupled to each computer functional unit through a first multiplexer. The scan input string is separated by the JTAG terminal under program control into a series of dedicated scan strings, each dedicated scan string being supplied to a selected functional unit through the first multiplexer. Each functional unit includes start and stop scan clocks for testing the functional under program control using the dedicated scan train for the functional unit. A test output terminal included in the JTAG terminal is coupled to each functional unit through a second multiplexer. The test results of the dedicated scan string under control of the scan clock are supplied to the output terminal through the second multiplexer. The compatible JTAG terminal includes further elements for controlling the scan clocks to select a targeted functional unit for testing purposes while the scan strings for non-targeted functional units remain in an inactive state.

10 Claims, 6 Drawing Sheets

CPU PLANAR
COPS
CPU BUS
4 LINES
CONTROL AND STATUS LINES
CLOCK AND BUFFER
OSC
10
11
12
13
14
16
18
20
22
24

25

TDO
TDI
22
12
COP
JTAG
MUX
53
O
47
MUX
26
IFU
28
BIU
40 2
40 1
AC1
BC1
AC2
BC2
FPU
40 3
32
40 4
FXU
AC3
BC3
AC4
BC4
40 6
AC6
BC6
40 5
AC5
BC5
30
34
40 7
LD/ST
AC7
BC7
AC8
BC8
40 8
DCU
36
40 10
AC9
BC9
40 9
AC10
BC10
41
40 11
AC11
BC11
AC12
BC12
40 12
IPU
38
MMU

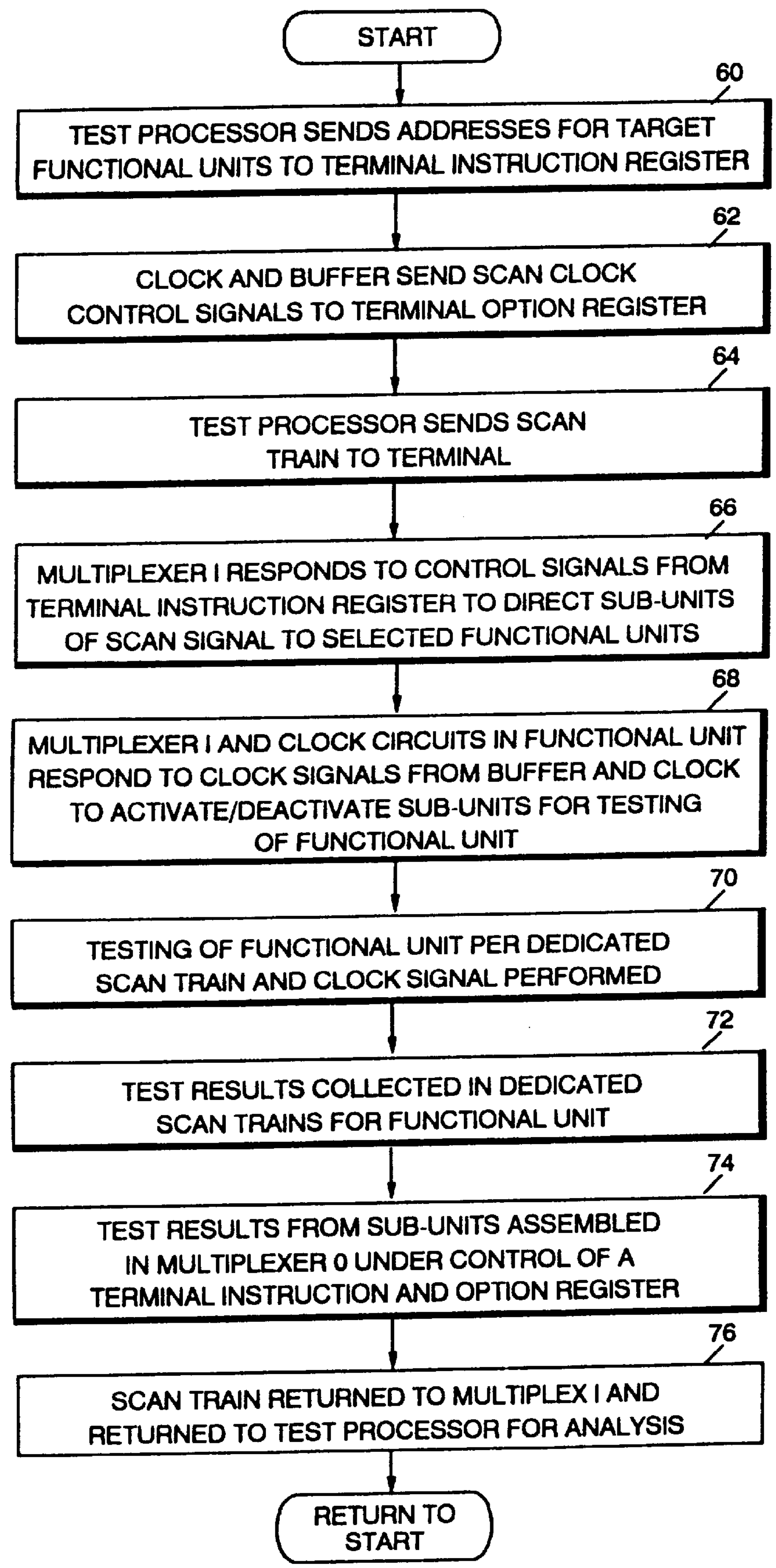
FIG. 7
START
60
TEST PROCESSOR SENDS ADDRESSES FOR TARGET FUNCTIONAL UNITS TO TERMINAL INSTRUCTION REGISTER
62
CLOCK AND BUFFER SEND SCAN CLOCK CONTROL SIGNALS TO TERMINAL OPTION REGISTER
64
TEST PROCESSOR SENDS SCAN TRAIN TO TERMINAL
66
MULTIPLEXER I RESPONDS TO CONTROL SIGNALS FROM TERMINAL INSTRUCTION REGISTER TO DIRECT SUB-UNITS OF SCAN SIGNAL TO SELECTED FUNCTIONAL UNITS
68
MULTIPLEXER I AND CLOCK CIRCUITS IN FUNCTIONAL UNIT RESPOND TO CLOCK SIGNALS FROM BUFFER AND CLOCK TO ACTIVATE/DEACTIVATE SUB-UNITS FOR TESTING OF FUNCTIONAL UNIT
70
TESTING OF FUNCTIONAL UNIT PER DEDICATED SCAN TRAIN AND CLOCK SIGNAL PERFORMED
72
TEST RESULTS COLLECTED IN DEDICATED SCAN TRAINS FOR FUNCTIONAL UNIT
74
TEST RESULTS FROM SUB-UNITS ASSEMBLED IN MULTIPLEXER 0 UNDER CONTROL OF A TERMINAL INSTRUCTION AND OPTION REGISTER
76
SCAN TRAIN RETURNED TO MULTIPLEX I AND RETURNED TO TEST PROCESSOR FOR ANALYSIS
RETURN TO START

APPARATUS AND METHODS FOR TESTING A MICROPROCESSOR CHIP USING DEDICATED SCAN STRINGS

BACKGROUND OF INVENTION

1. Field of the Invention

This invention relates to testing apparatus and methods of operation. More particularly, the invention relates to apparatus and methods for testing microprocessor chips using scan strings.

2. Description of Prior Art

Testing operations for microprocessor chips usually require the chip to go from a perfectly idle state, where all the clocks, both functional and scanned are completely off, to a state where the scanned clocks are turned on for scanning. This is normally what happens every time a test or service processor is to read or write the state of the chip internal logic. Since the scan clocks affect every scannable latch element on a chip (and in some cases every dynamic circuit if the scan clock is also shared as a system clock), the node toggle activity of the chip can easily reach the 50 percent mark where, in that mode, a 0.5 probability exists that a typical node would toggle or switch to an active state. It is not very unusual that the percentage of node toggling can be very much higher than 50 percent (as compared to a typical 20 percent node toggle activity when the chip is running functional code). All of this leads to a higher than average current spikes in the chip, especially when the first scan clock is going active immediately after the chip has been in the idle state (clocks off). In some cases, the inability of the power supply to compensate for the sudden drop in voltage within an appropriate time window, can lead to the chip voltage dropping below a threshold level beyond which the storage elements and dynamic circuits in the chip can lose their storage states.

Another problem encountered is storing test data received by a test or service processor from the chip under test. Every time the chip is read, memory space must be allocated to store the state of the chip latches. The time to access the state of a chip can also be prohibitive since all scan strings on the chip must be connected into a super long scan string accessible by the test processor through a Joint Test Action Group (JTAG) or JTAG/IEEE 1149.1 test port.

Still another problem is broken long scan strings in the testing of microprocessor chips. Design verification of the test function requires that long scan strings be perfectly connected together. When a long scan string is broken design verification is delayed until the scan string is connected together.

Accordingly, a test apparatus and method which overcomes the foregoing problems will advance the state of the art in testing microprocessor chips.

The prior art related to testing integrated chips is as follows:

U.S. Pat. No. 4,503,537 issued Mar. 5, 1985, discloses a parallel path self-testing system for a circuit module. Test chips in the module contain switching circuits to connect scan paths of the chips in parallels between different stages of a random signal generator and a data compression means. The switching circuits also disconnect scan paths from a signal generator and data compression circuitry and arrange the circuits in a single scan path to perform testing.

U.S. Pat. No. 4,597,042 issued Jun. 24, 1986, discloses a device for selectively loading data in and reading data out of latch strings located in irreplaceable units containing the circuitry of a data processing system realized in accordance with Level Scan Sensitive Design (LSSD) technique. Data to be loaded and read out of a latch string is propagated in a data loop under control of an addressing circuit.

U.S. Pat. No. 4,872,169 issued Oct. 3, 1989, discloses testing circuitry which consists of a series of shift registers or latches which form a serial scan path through a logic circuit. The scan path is used to observe and control logic elements in the design by a serial scan operation. The scan path can be compressed or expanded so that the scan path only passes through a desired logic element to be tested. Devices connected on a scan path can be selected or deselected allowing the serial path to either flow through or by-pass a given logic circuit's internal scan path.

U.S. Pat. No. 4,897,837 issued Jan. 30, 1990, discloses a plurality of shift registers connected in series between an input terminal for inputting test patterns and an output terminal for outputting the signal as a result of the test operations. The test pattern signals are shifted by the shift registers to apply corresponding test patterns to each of the circuit portions. The result of each of the circuit portions is taken into a shift register and shifted to the direction of the output terminal. A by-pass circuit applies a test pattern signal from the input directly to the prescribed shift register and not through the other shift registers on the way to the circuit on test.

U.S. Pat. No. 5,233,612 issued Aug. 3, 1993, discloses a test device for an integrated chip including a first processor, the test device including interface means for interfacing the first processor with other circuits and a second processor coupled to the first processor as an emulator. The interface means includes a scan path constituted by a string of first cells and including serially connected buffer means able to latch data normally transferred between the processor means and the circuit. A comparator compares data in a scan path from the second processor with data received in a second scan path from the first processor.

U.S. Pat. No. 5,253,255 issued Oct. 12, 1993, discloses a method of debugging the operation of an integrated circuit chip by loading a shift register in parallel with data from internal test points thereby taking a snapshot of the internal state of a chip at a desired clock cycle. The data is then shifted out of the shift register serially, one bit per clock. The data is displayed in a usable form on a computer display. The process is repeated by looping back to the beginning of the test to take a snapshot one clock later than the previous test capture point.

U.S. Pat. No. 5,325,368 issued Jun. 28, 1994, discloses a test bus incorporated into a computer system including a plurality of components, each component in turn including boundary scan architecture for testing the components by the test bus. Non-volatile memory is coupled to the test bus to store boundary scan information for each of the components in the non-volatile memory. The non-volatile memory is accessed to retrieve boundary scan information required by the test bus for testing the component.

U.S. Pat. No. 5,42,644 issued Aug. 15, 1995 discloses a universal multiple interconnect sensing module capable of sensing a very large number of interconnection points and equipment under test. The universal module includes a transmitter/receiver for each interconnection point. An address generator coupled to the transmitter/receiver generates an address signal at a unique time period. Logic control circuits coupled to the output of each receiver sense the state of the receiver at each individual unique address time. The control circuits constrain the information received from the receiver and generate an output coupled to an encoder which generates information indicative of all interconnections, opens and grounds in the equipment under test during each unique time period.

U.S. Pat. No. 5,491,666 issued Feb. 13, 1996, and having an effective filing date of Mar. 10, 1994, discloses apparatus and a method for allowing separate portions of an integrated circuit to be individually tested and otherwise manipulated and configured. The apparatus utilizes boundary scan or similar shift register circuitry without affecting operations in other circuits and other sections of the integrated circuits. A plurality of individual boundary scan or similar shift register circuits are associated with separate portions of the circuitry of the integrated circuit. The registers of the individual boundary scan circuits are joined to provide a series boundary scan register chain with a plurality of individual controllers within an integrated circuit so that individual portions of the circuitry included within the integrated circuit may be individually manipulated.

U.S. Pat. No. 5,495,487 issued Feb. 27, 1996, and having an effective filing of Sep. 7, 1988, discloses a boundary scan test system which provides partitioning devices, such as registers, latches, transceivers and buffers, with boundary scan testability to provide observation and control of input to and from combinatorial logic which does not have boundary scan testability.

U.S. Pat. No. 5,515,505 issued May 7, 1996, and having a filing date of Nov. 4, 1994, discloses a semi-conductor integrated circuit with a boundary scan circuit composed of logic circuits having different logic levels. A plurality of serially connected test circuits are connected between the logic circuits and input and output pins. The serially connected test circuits include a first group of test circuits having the same logic level as those of the input/output pins. The test circuits of the first group are connected directly in series to each other. A second group of test circuits having logic levels different from those of the input pins are connected to a plurality of level converters for converting logic levels. The test circuits of the second group are connected through the level converters to the input/output pins.

None of the prior art discloses or suggests individually manipulated scan strings of a plurality of integrated circuits to reduce excessive voltage drop in a circuit; memory allocations for test results; scan time, and loss of access to chip internals due to a break in a Long Shift Register Latch (LSRL) scan.

SUMMARY OF THE INVENTION

An object of the invention is an improved test apparatus and method of operation for scan testing of high-performance semi-conductor chips.

Another object is an improved test apparatus and method of operation which limits voltage swings in scan testing of high-performance microprocessor chips.

Another object is an improved test apparatus and method of operation which reduces memory requirements for storage of test results in scan testing of microprocessor chips.

Another object is an improved test apparatus and method of operation having reduced scan time in scan testing of high-performance microprocessor chips.

Another object is an improved test apparatus and method of operation which provides faster design verification of high-performance microprocessor chips.

Another object is an improved test apparatus and method of operation which eliminates the need for a support processor to rescan in a stored state of scan strings after every scan read operation.

Another object is an improved test apparatus and method of operation having a reduced probability of a broken scan string and loss of design verification of a chip internal logic.

Another object is an improved JTAG port in scan testing of a microprocessor chip.

These and other objects, features and advantages are achieved in a test apparatus for design verification of at least one microprocessor chip having a compatible Joint Task Action Group (JTAG) terminal. A plurality of computer functional units are contained in the chip for testing of design verification through the compatible JTAG terminal. A test input terminal included in the JTAG terminal receives a scan string, the string being coupled to each computer functional unit through a first multiplexer. The scan input string is divided into a series of dedicated scan strings, each dedicated scan string being supplied to a selected functional unit through the first multiplexer. Each functional unit includes start and stop scan clocks for entering the dedicated scan string into the functional unit for test purposes. A test output terminal included in the JTAG terminal is coupled to each functional unit through a second multiplexer. The test results of the dedicated scan string under control of the scan clock are supplied to the output terminal through the second multiplexer. The compatible JTAG terminal includes further means for controlling the scan clocks to select a targeted functional unit for testing purposes while the scan strings for non-targeted functional units remain in an inactive state. By limiting the functional units under test, the voltage swing in the chip is reduced for test purposes; scan time for testing is decreased; memory space allocation for storing test results is reduced and design verification is not delayed by the loss of access to functional units due to a break in the scan signal.

FIG. 7 is a flow diagram of a process for testing the microprocessor chip of FIG. 5.

DESCRIPTION OF PREFERRED EMBODIMENT

Figure 1:
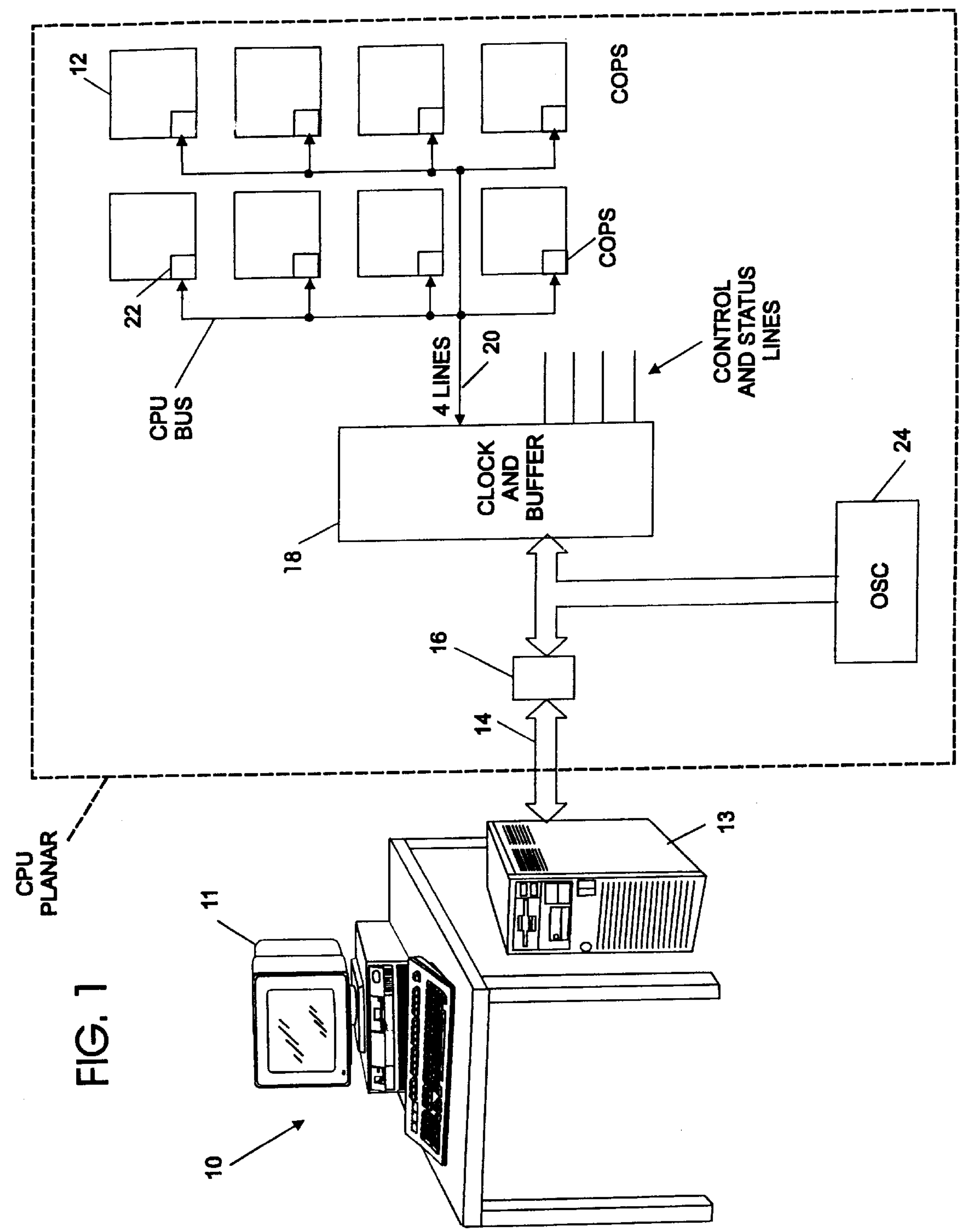
FIG. 1 is a representation of a test apparatus using scan testing of a semi-conductor chip for design verification and functional and incorporating the principles of the present invention.

In FIG. 1, a test system 10 is coupled to a plurality of microprocessor chips 12 through a cable 14; connector 16; buffer 18 and a JTAG bus 20. Each chip 12 includes a compatible JTAG port 22 for receiving a scan train for verifying the logical design of the chip or performing a boundary scan test. The test system 12 includes a workstation 11 capable of running large programs from a permanent storage 13. The test system 10 can issue 3 classes of commands: debug, system and test. Debug commands are used only during engineering bring-up and require diagnostic programs to be executed and large data files to be manipulated, for example a dump of all system chip register latches (SRLs). System commands are part of the normal system set-up, for example, system initialization or parity error handling. Test commands control DC chip-to-chip wiring tests and stand-alone chip AC/DC self-tests for both logic and embedded arrays. An On Chip Sequencer (OCS) 24 is an off-the-shelf micro controller with on-chip non-volatile storage. The OCS 24 is intended only for system initialization, limited maintenance and self-test. The clock and buffer unit 18 provide timing and storage of data transferred between the chip and the test system 10 by way of the JTAG bus 20. The unit 18 also provides control and status lines to the chips under test. The test system architecture and operation is more fully described in an IBM Technical Disclosure Bulletin, Volume 32, Number 12, published May 1990 at pp. 448–451 which is fully incorporated herein by reference.

Figures 2, 6:
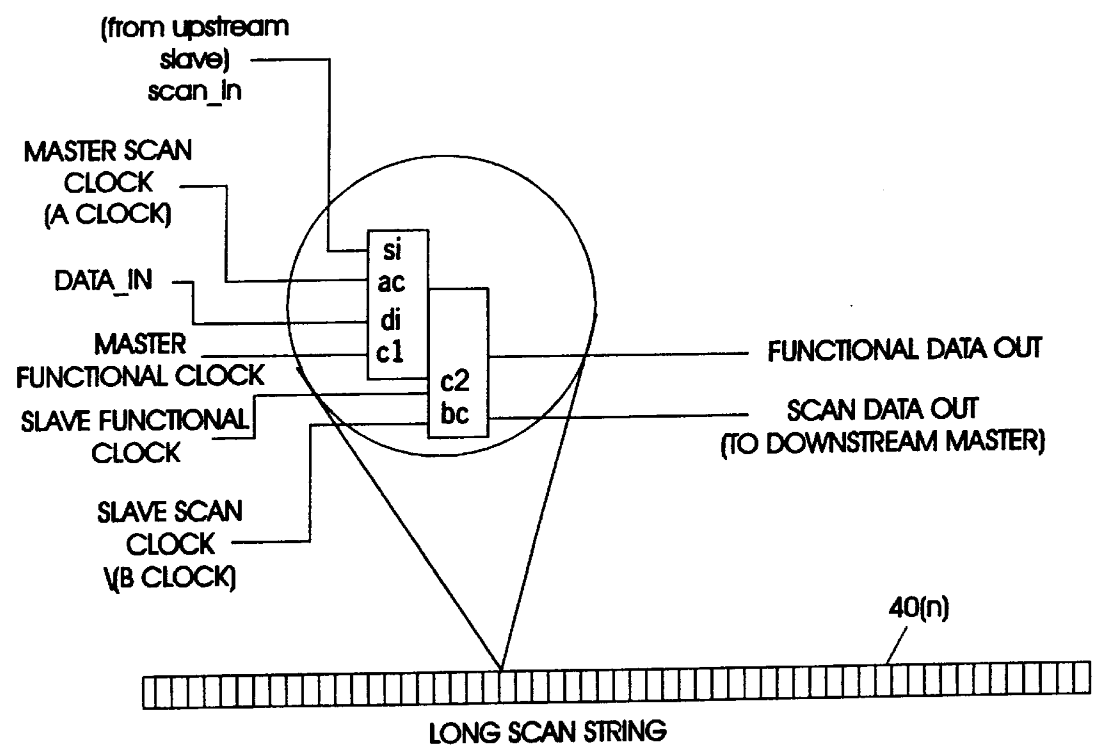
FIG. 2 is a representation of a scan test signal supplied by the test or service processor of FIG. 1 to the chip under test.
FIG. 6 is a representation of a dedicated long string scan and operation of scan and functional clocks in testing or operation of a functional unit, respectively in the microprocessor chip of FIG. 5.

The micro chips 12 may be any semi-conductor chip containing logic and memory. One semi-conductor chip to which the present invention is applicable is the Power PC™ 601 RISC Microprocessor Chip which includes a compatible JTAG terminal to which the present invention is applicable. The chip 12 is described in the Power PC™ 601 RISC Microprocessor User Manual, 52G7484, published 1993 by IBM Micro Electronics, Essex Junction, Vt. which manual is fully incorporated herein by reference. The PPC 601 Processor includes a set of signals that facilitate debug control and observation through the special compatible JTAG port or terminal 22. The terminal 22 implements chip scan strings for testing chip internal logic; boundary scan testing and functional operation of the chip. Both internal scan strings and boundary scan strings use a serial path of scan registers in functional units, for example, instruction fetch unit (IFI); branch instruction unit (BIU); floating point unit (FPU); load and store units (LD/ST); etc. included in the microprocessor (see FIG. 3). Each scan chain 25, as shown in FIG. 2, comprises a series of bits which are directly controllable or observable for design verification of chip internal logic or boundary scan purposes during inbound and outbound testing of the chip. One example of scan string is a boundary scan chain for the PowerPC 601 which is 424 bits long (0–423). Appendix 1 shows the pin number, signal name and scan chain bit position for each boundary/scan pin in the PPC 601. Pins that do not have boundary scan latches are shown with N/A in the bit position column.

The compatible JTAG terminal 22 provides the necessary support and control logic to achieve built in set self-tests, power on reset, debug and field support operations of the chips 12 at the card and system levels. Debug operations under direct control of the terminal 22 include the following:

(i) Stop code execution.

(ii) Stop after executing "n" cycles.

(iii) Load and unload scan strings.

(iv) DMA operations.

A description of a prior art compatible JTAG terminal 22 is provided in IBM Technical Disclosure Bulletin, Volume 33, Number 2, July 1990, pp. 2–8, which is fully incorporated herein by reference.

Figure 3:
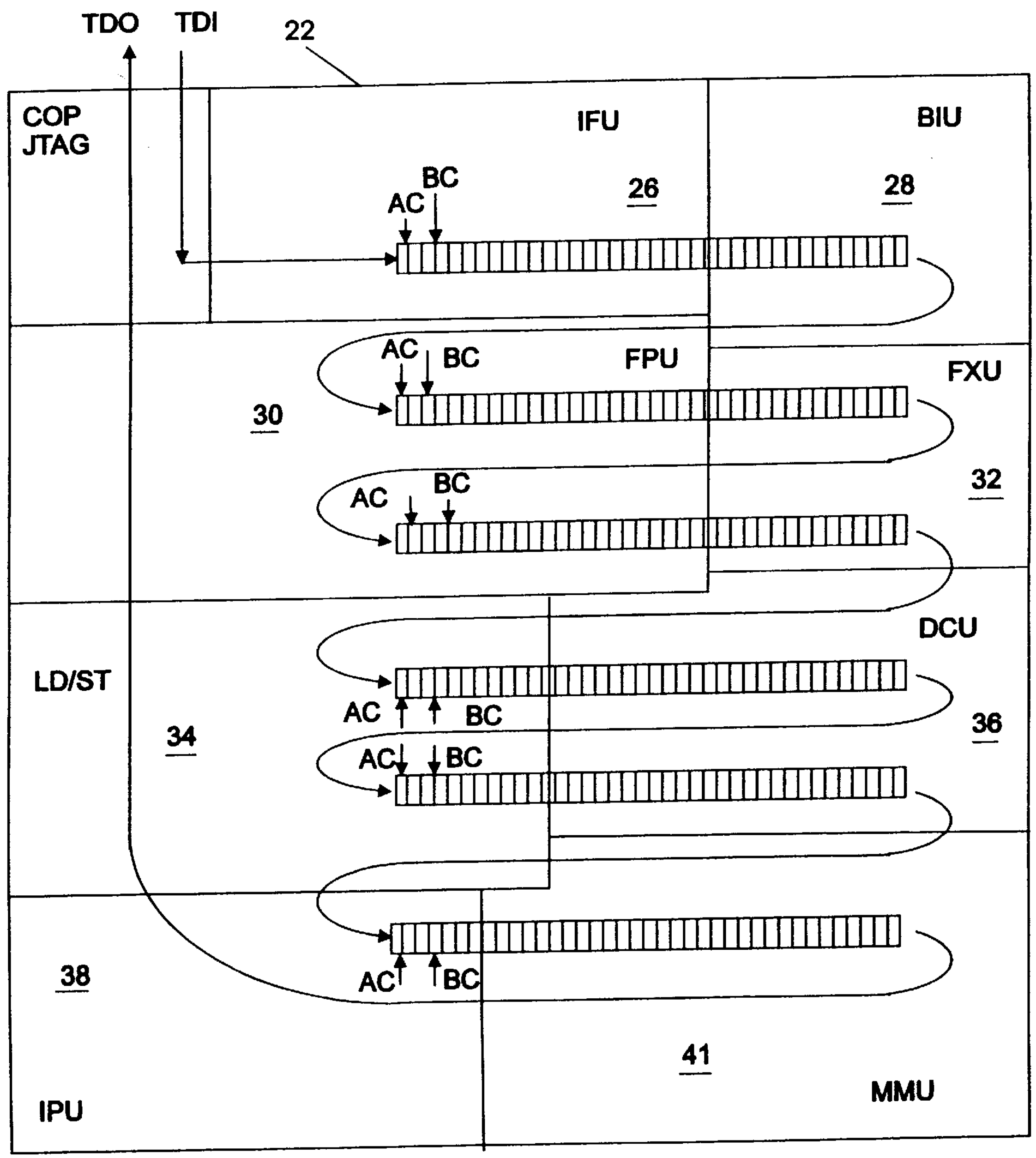
FIG. 3 is a prior art example of scan signal testing of a microprocessor chip through a JTAG port.

Turning to FIG. 3, a prior art method is shown for allowing a test processor access to the internal logic of the microprocessor 12 for design verification or boundary scan purposes. Included in the microprocessor 12 are the compatible terminal 22 and the following processor functional units: Instruction Fetch Unit (IFU) 26; Bus Interchange Unit (BIU) 28; Floating Point Unit (FPU) 30; File Exchange Unit (FXU) 32; Load and Store Unit (LD/ST) 34; Direct Cache Unit (DCU) 36; Instruction Processing Unit (IPU) 38; and Memory Management Unit (MMU) 41. The architecture and operation of each these functional units is described in the PPC 601 User Manual, supra.

The a scan train (n) (see FIG. 6) is supplied to the terminal TDI and serially passed through each of the functional units of the chip 12 unit. Each functional unit includes one or more logic trains of master and slave latches (not shown) responsive to the scan train 25 under the control of a master scan clock AC and a slave scan clock BC. The master clocks are initialized by the terminal 22 to respond to the scan bits contained in the scan train for that sub-unit. Likewise, the slave clock is initialized by the terminal 22 to respond to the scan bits in the scan train for that functional unit. The outputs of the master latches and slave latches are supplied to the scan train, which after passing through all of the functional units is returned to the test processor through the terminal TDO. The method of connecting all scan strings in series is referred to as Long Shift Register Latch (LSRL) which is a common implementation in the prior art. Testing of chips using the LSRL method results in excessive node toggling, storage requirements for test result and delayed design verification when breaks occur in the long scan train.

Figure 4:
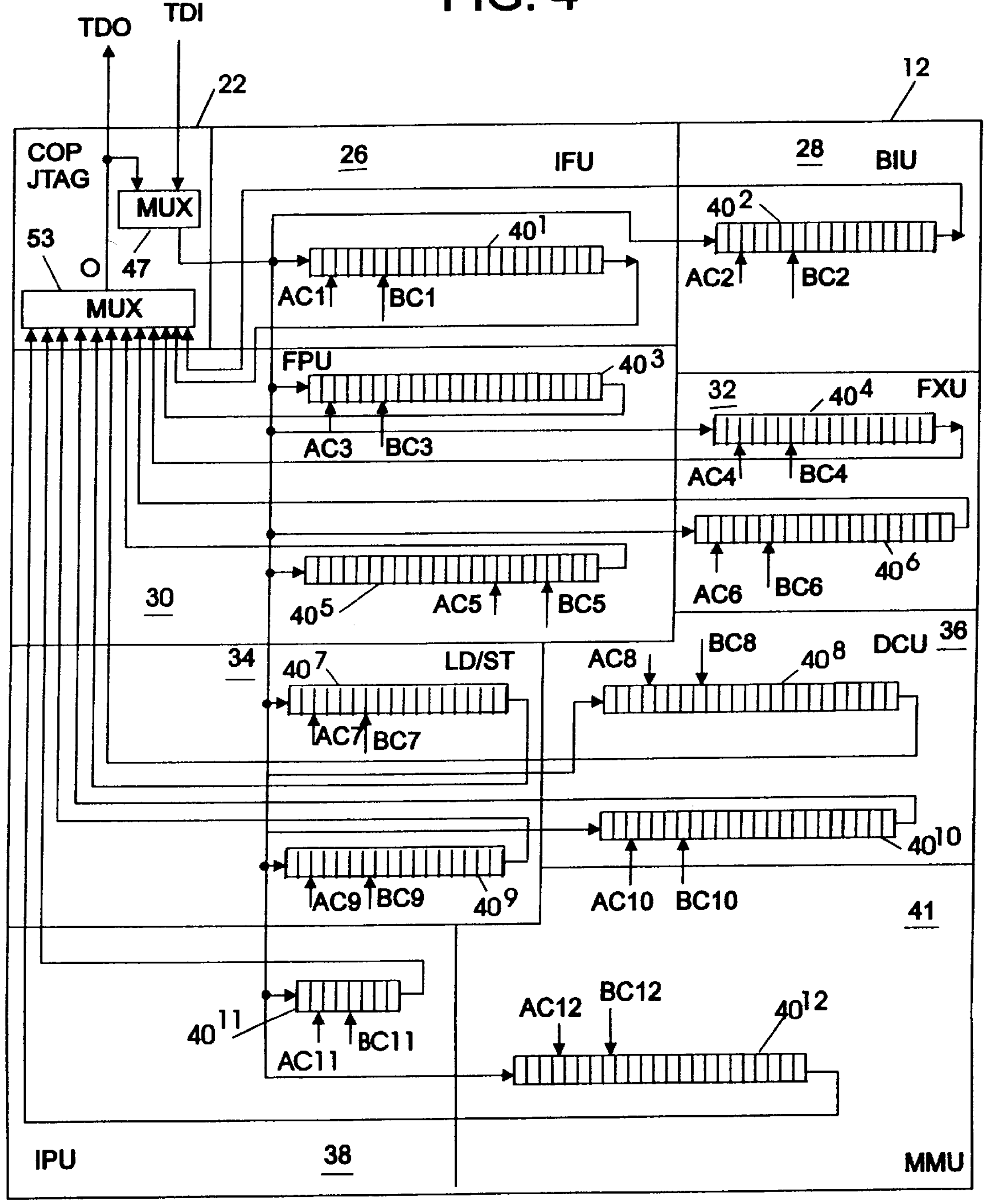
FIG. 4 is a representation of dedicated scan trains applied to functional units of a microprocessor for functional operation or design verification purposes.

FIG. 4 provides an overview of the invention. The serial scan string 25 is received at the multiplexer 47 through the input terminal TDI. The multiplexer 47, as will be explained in connection with FIG. 5, divides the scan string 40 into sub-units $\mathbf{40}^{1} \ldots \mathbf{40}^{12}$, each sub-unit dedicated to a particular functional unit in the chip 12. Thus, functional unit IFU receives dedicated scan string $\mathbf{40}^{1}$; functional unit BIU receives scan string $\mathbf{40}^{2}$ . . . and functional unit MMU receives dedicated scan string $\mathbf{40}^{12}$. Each dedicated scan string is controlled by dedicated scan clocks AC and BC. Scan clocks AC control master latches in the functional unit while scan clocks BC control slave latches in the functional unit as was previously explained. The terminal 22, as will be explained in connection with FIG. 6, controls the dedicated scan clocks in each functional unit. A field of four bits in the instruction register 43 (See FIG. 4) is loaded with appropriate bit values so that only a target scan string clocks are active and serial input data is fed to that target scan string only. Other scan strings are not affected. The test result derived from the scan string for a particular functional unit are returned to the multiplexer 53, the output of which is provided to the output terminal TDO. Again, a scan string for a particular functional unit may be read by the test processor only if the scan string clocks for that functional unit are active. Other scan string clocks be it scan or functional remain off while the target scan string is being read. A field of "n" bits, where "n" is any small non-zero integer, in the terminal option register defines the address of the target scan string and provides the appropriate select signals to multiplexer 47 which routes the various scan string outputs to the TDO pin. Read data at multiplexer 53 is recirculated through multiplexer 47 which allows for a non-destructive read of scan strings. This feature eliminates the need for the test processor to rescan in the stored state of a scan string after every scan/read operation. Recirculating read/scan data eliminates unnecessary communication between the test processor and the terminal 22 over the bus 15 which saves scan time and memory space allocation needed to store the state of the target scan string.

Figure 5:
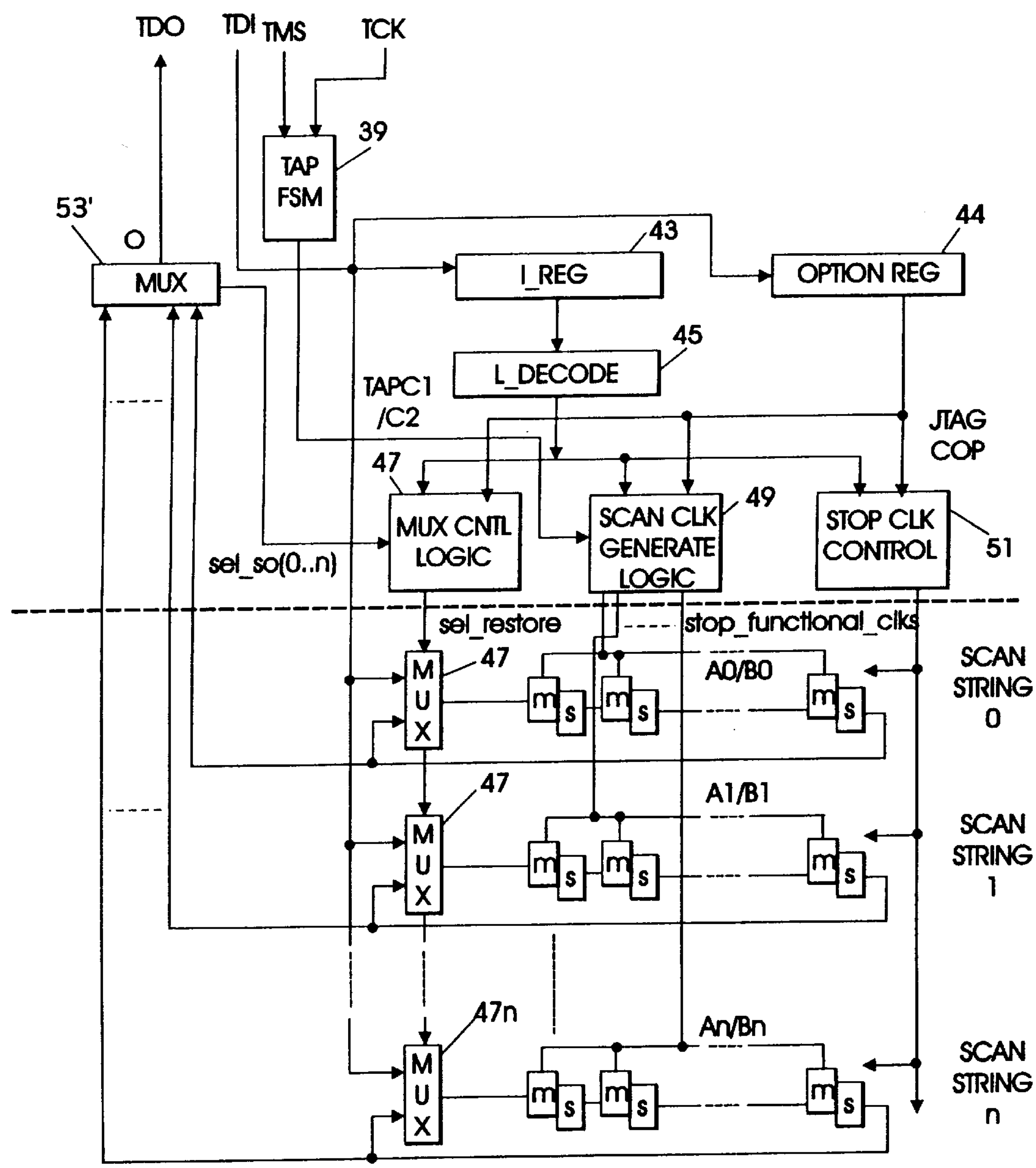
FIG. 5 is a block diagram of a compatible JTAG port incorporated in a microprocessor chip and implementing the principles of the present invention.

FIGS. 5 and 6 will now be described to provide further details of the invention. In FIG. 5, a clock unit 39 in the terminal 22 receives clock inputs TMS and TCK from the clock and buffer 18 (see FIG. 1) where TMS is the master scan clock and TCK is the system clock. An instruction register 43 connected to input terminal TDI receives the scan train 40(*n*) (see FIG. 6) for application to selected functional units for functional or scan test. The input terminal TDI is also connected to an options register 44 for directing the functional units of the microprocessor between functional operation and scan testing for design verification, according to the scan train 40(*n*). A functional test exercises a microprocessor unit according to program instruction. Scan testing exercises a unit for design verification. The instruction register 43 provides an output to decoder 45 which in turn provides instructions to a multiplexer control logic (MUX CNTL LOGIC) 47 hereinafter multiplexer 47; a scan clock generate logic 49 and a stop clock control 51.

The multiplexer 47 directs the scan train to selected functional units 26 . . . 41 (see FIG. 4) according to the instructions received from the decoder 45 and the options register 44. Each microprocessor functional unit 26 . . . 40 receives a dedicated portion of the scan train 25, shown in FIG. 4 as scan string 0, scan string 1 . . . scan string (n) where "n" is the total number of units in the microprocessor 12. The dedicated scan strings in each functional unit provide scan or functional results to a multiplexer $47^0$ . . . $47^n$.

The scan clock generate logic unit 49 receives the scan clock signal, which may be at frequencies C1/C2, from the clock unit 39, and together with inputs from the decoder 45 and options register generates a set of clock signals including a master functional clock signal; a slave functional clock signal; a master scan clock (A) signal and a slave scan clock (B) signal. The unit 49 provides the set of clock signals to flip-flops or latches (not shown) in each functional unit, as will be explained in more detail hereinafter.

The stop clock control 51 receives the outputs of the decoder 45 and options register 44 and provides an output to terminate the operation of the functional or scan clocks in the functional units according to the options register input.

The multiplexer 47 and the scan clock generate logic unit 49 enable one or more functional units to be operated under program instruction or scan tested while the other functional units are inactive. The test results for each dedicated scan train are individually returned to the multiplexer 53 which under control of the instruction and options registers reassembles the dedicated scan trains into a single scan train for return to the support processor system 10 (see FIG. 1) through the output terminal TDO. The ability of the terminal 22 to limit operation or testing of functional units limits voltage drop in the chip under test and accompanying node toggling in the chip. The output of the multiplexer 53 may also be returned to the multiplexer 47 which saves time for the test processor in providing scan trains to the multiplexer 47 to initiate functional operation or testing for design verification of the functional units.

In FIG. 6, a dedicated scan train 40(*n*) is shown in a microprocessor functional unit. Each bit of the train is successively applied to a designated flip-flop or latch (not shown) in the functional unit for functional operation or testing for design verification purposes. The scan data out or functional data out from the upstream flip-flop in the functional unit are applied as an input to a terminal scan in (si) or data in terminal (di) of the down stream flip-flop (not shown), according to whether a scan test or functional operation is to be performed in the functional unit. When the master clock is applied to a terminal ac or a terminal c1 of the flip-flop, the scan test or functional operation is performed as the case may be. When the slave functional clock is applied to the terminal c2 or the slave scan clock is applied to the terminal bc of the flip-flop, as the case may be, the functional data out or the scan data out are provided to the down stream scan in terminal si or functional data in terminal di.

In summary, the dedicated scan train is applied bit by bit to the flip-flops in the functional unit for functional operation or design verification purposes, according to the outputs provided by multiplexer 47 and the scan control logic 49 (see FIG. 5). The stop clock control 51 can terminate testing or operation in a functional unit according to the options register input.

In FIG. 7, a computer program stored in the test system 10 starts an operation 60 to send the instruction register 43 in the terminal 22 the addresses of dedicated scan trains in the scan train 251 for the respective functional units in the chip 12.

In an operation 62, the clock and buffer under control of the OCS sends scan clock signals to the clock unit 39 in the terminal 22 for controlling the scan clocks in each functional unit.

A scan test signal 25 is provided by the test processor system 10 to the terminal 22 in an operation 64.

Multiplexer 47 responds to the instruction register 43 and option register 45 to divide the scan train 25 into dedicated scan trains 40(*n*) for each functional unit in an operation 66.

In an operation 68, the clock control circuits responsive to the decoder and the options register control the testing of functional units using the respective dedicated scan trains.

Testing of one or more targeted functional units for functional operation or design verification is performed in an operation 70 while testing of the other functional units is inactive.

In an operation 72, test results from the functional units are returned to the Multiplexer 53 under control of the scan slave clocks in the respective functional units.

Test results from the respective functional units are assembled in the Multiplexer 53 as a single scan train under control of the instruction and option registers through the multiplexer 47 in an operation 74.

In an operation 76, the Multiplexer 53 returns the assembled scan train to the Multiplexer 47 and/or to the test system 10 for analysis, and the process returns to Start.

In summary, the inventive feature of separating a single scan string into a plurality of sub-scan strings reduces node toggle activity in the chip during testing. Each sub-scan string is under the control of dedicated scan clocks for testing of a particular functional unit which reduces the number of scannable latches in the testing process relative to single string of the prior art. By reducing the number of scannable latches during the test process, the chip voltage drop problem is reduced, assuming equal number of scannable latches in every scan string and only the nodes associated with a target scan string would be toggling.

The inventive features of writing or reading a scan string for a particular functional unit dramatically reduces the scan time to scan in/scan out a particular unit on the chip. For example, to scan out an IFU unit using the Long Shift Register Latch (LSRL) technique of the prior art would require scanning out all units before the IFU test results were obtained simply because the IFU would be at the tail end of the LSRL scan string. Being able to scan out the IFU scan string directly improves scan time considerably.

The feature of recirculating output scan data through the input multiplexer eliminates the need for the test processor to rescan in the stored state of a scan string after every scan/read operation. This feature saves scan time, memory space allocation needed to store the state of target scan string and unnecessary communication between the support processor and the terminal 22 over the bus 15.

The problem of broken long scan strings which must be perfectly connected together for design verification has been overcome by separating the string into dedicated scan strings for each functional unit. Using short chip sub-unit simulation models, faster design verification is achieved.

While the invention has been described in terms of a preferred embodiment, various modifications may be made in the embodiment without departing from the spirit and scope of the invention as defined in the appended claims, in which:

APPENDIX I

IEEE 1149.1 Boundary-Scan Chain Description

| Pin Number | Signal Name | Type | Bit Position | Inverted |
|---|---|---|---|---|
| 1 | TST21 | Input | N/A | |
| 3 | TST20 | Input | N/A | |
| 4 | TST16 | Input | N/A | |
| 5 | TST11 | Input | N/A | |
| 7 | TST13 | Input | N/A | |
| 8 | TST15 | Input | N/A | |
| 9 | TST17 | Input | N/A | |
| 10 | TST14 | Input | N/A | |
| 13 | TST9 | Input | N/A | |
| 14 | TST6 | Input | N/A | |
| 15 | TST7 | Input | N/A | |
| 17 | TST8 | Input | N/A | |
| 18 | A0 | I/O | 141/108 | |
| 19 | A1 | I/O | 142/109 | |
| 21 | A2 | I/O | 143/110 | |
| 22 | A3 | I/O | 144/111 | |
| 23 | A4 | I/O | 145/112 | |
| 26 | A5 | I/O | 146/113 | |
| 27 | A6 | I/O | 147/114 | |
| 28 | A7 | I/O | 148/115 | |
| 30 | A8 | I/O | 149/116 | |
| 31 | A9 | I/O | 150/117 | |
| 32 | A10 | I/O | 151/118 | |
| 34 | A11 | I/O | 152/119 | |
| 35 | A12 | I/O | 153/120 | |
| 36 | A13 | I/O | 154/121 | |
| 41 | A14 | I/O | 155/122 | |
| 42 | A15 | I/O | 156/123 | |
| 43 | A16 | I/O | 157/124 | |
| 45 | A17 | I/O | 158/125 | |
| 46 | A18 | I/O | 159/126 | |
| 47 | A19 | I/O | 160/127 | |
| 49 | A20 | I/O | 161/128 | |
| 50 | A21 | I/O | 162/129 | |
| 51 | A22 | I/O | 163/130 | |
| 54 | A23 | I/O | 164/131 | |
| 55 | A24 | I/O | 165/132 | |
| 56 | A25 | I/O | 166/133 | |
| 58 | A26 | I/O | 167/134 | |
| 59 | A27 | I/O | 168/135 | |
| 60 | A28 | I/O | 169/136 | |
| 62 | A29 | I/O | 170/137 | |
| 63 | A30 | I/O | 171/138 | |
| 64 | A31 | I/O | 172/139 | |
| 67 | AP0 | I/O | 198/269 | |
| 68 | AP1 | I/O | 199/270 | |
| 69 | AP2 | I/O | 200/271 | |
| 70 | TST19 | Output | N/A | |
| 71 | AP3 | I/O | 201/272 | |
| 72 | $\overline{\text{CKSTP\_OUT}}$ | Output | 423 | |
| 74 | RUN_NSTOP | Output | N/A | |
| 75 | DH31 | I/O | 376/32 | |
| 78 | SCAN_OUT | Output | N/A | |
| 80 | DH30 | I/O | 375/31 | |
| 81 | DH29 | I/O | 374/30 | |
| 82 | DH28 | I/O | 373/29 | |
| 83 | DH27 | I/O | 372/28 | |
| 84 | DH26 | I/O | 371/27 | |
| 85 | DH25 | I/O | 370/26 | |
| 86 | DH24 | I/O | 369/25 | |
| 90 | DH23 | I/O | 368/24 | |
| 91 | DH22 | I/O | 367/23 | |
| 93 | DH21 | I/O | 366/22 | |
| 94 | DH20 | I/O | 365/21 | |
| 95 | DH19 | I/O | 364/20 | |
| 97 | DH18 | I/O | 363/19 | |
| 98 | DH17 | I/O | 362/18 | |
| 99 | DH16 | I/O | 361/17 | |
| 103 | DH15 | I/O | 360/16 | |
| 104 | DH14 | I/O | 359/15 | |
| 106 | DH13 | I/O | 358/14 | |
| 107 | DH12 | I/O | 357/13 | |
| 108 | DH11 | I/O | 356/12 | |
| 110 | DH10 | I/O | 355/11 | |
| 111 | DH9 | I/O | 354/10 | |
| 112 | DH8 | I/O | 353/9 | |
| 118 | DH7 | I/O | 352/8 | |
| 119 | DH6 | I/O | 351/7 | |
| 121 | DH5 | I/O | 350/6 | |
| 122 | DH4 | I/O | 349/5 | |
| 123 | DH3 | I/O | 348/4 | |
| 125 | DH2 | I/O | 347/3 | |
| 126 | DH1 | I/O | 346/2 | |
| 127 | DH0 | I/O | 345/1 | |
| 130 | DL31 | I/O | 413/69 | |
| 131 | DL30 | I/O | 412/68 | |
| 132 | DL29 | I/O | 411/67 | |
| 134 | DL28 | I/O | 410/66 | |
| 135 | DL27 | I/O | 409/65 | |
| 136 | DL26 | I/O | 408/64 | |
| 138 | DL25 | I/O | 407/63 | |
| 139 | DL24 | I/O | 406/62 | |
| 140 | DL23 | I/O | 405/61 | |
| 143 | DL22 | I/O | 404/60 | |
| 144 | DL21 | I/O | 403/59 | |
| 145 | DL20 | I/O | 402/58 | |
| 147 | DL19 | I/O | 401/57 | |
| 148 | DL18 | I/O | 400/56 | |
| 149 | DL17 | I/O | 399/55 | |
| 151 | DL16 | I/O | 398/54 | |
| 155 | DL15 | I/O | 397/53 | |
| 157 | DL14 | I/O | 396/52 | |
| 159 | DL13 | I/O | 395/51 | |
| 161 | DL12 | I/O | 394/50 | |
| 165 | DL11 | I/O | 393/49 | |
| 167 | DL10 | I/O | 392/48 | |
| 168 | DL9 | I/O | 391/47 | |
| 169 | DL8 | I/O | 390/46 | |
| 172 | DL7 | I/O | 389/45 | |
| 173 | DL6 | I/O | 388/44 | |
| 178 | DL5 | I/O | 387/43 | |
| 180 | DL4 | I/O | 386/42 | |
| 181 | DL3 | I/O | 385/41 | |
| 182 | DL2 | I/O | 384/40 | |
| 184 | SCAN_CTL | Input | N/A | |
| 185 | DL1 | I/O | 383/39 | |
| 186 | SCAN_SIN | Input | N/A | |
| 187 | SCAN_CLK | Input | N/A | |
| 188 | DL0 | I/O | 382/38 | |
| 194 | DP7 | I/O | 417/73 | |
| 195 | DP6 | I/O | 416/72 | |
| 197 | DP5 | I/O | 415/71 | |
| 198 | DP4 | I/O | 414/70 | |
| 199 | DP3 | I/O | 380/36 | |
| 201 | DP2 | I/O | 379/35 | |
| 202 | DP1 | I/O | 378/34 | |
| 203 | DP0 | I/O | 377/33 | |
| 210 | SC_DRIVE | Input | 231 | |
| 211 | CSE1 | Output | 87 | |
| 212 | CSE2 | Output | 88 | |
| 214 | $\overline{\text{WT}}$ | Output | 84 | Inverted |
| 215 | CSE0 | Output | 86 | |
| 216 | $\overline{\text{CI}}$ | Output | 83 | Inverted |

APPENDIX I-continued

IEEE 1149.1 Boundary-Scan Chain Description

| Pin Number | Signal Name | Type | Bit Position | Inverted |
|---|---|---|---|---|
| 219 | BR | Output | 209 | Inverted |
| 220 | DBB | I/O | 177/217 | |
| 221 | ARTRY | I/O | 175/326 | |
| 222 | DPE | Output | 97 | |
| 224 | ABB | I/O | 205/216 | |
| 226 | TS | I/O | 186/214 | Inverted input only |
| 227 | TT1 | I/O | 191/274 | |
| 228 | TT0 | I/O | 190/273 | |
| 229 | XATS | I/O | 194/211 | Inverted input only |
| 231 | APE | Output | 98 | |
| 232 | TSIZ1 | I/O | 188/279 | |
| 233 | GBL | I/O | 181/85 | Inverted output only |
| 235 | SHU | I/O | 182/325 | |
| 236 | TBST | I/O | 184/277 | |
| 237 | TSIZ2 | I/O | 189/280 | |
| 238 | TT4 | Output | 286 | |
| 241 | TSIZ0 | I/O | 187/278 | |
| 243 | TC0 | Output | 89 | |
| 244 | TT3 | I/O | 193/276 | |
| 246 | TST2 | Output | N/A | |
| 247 | TST3 | Output | N/A | |
| 248 | TT2 | I/O | 192/275 | |
| 250 | HP_SNP_REQ | IN | 196 | |
| 251 | TC1 | Output | 90 | |
| 254 | RSRV | Output | 210 | |
| 255 | TST22 | Input | 232 | |
| 256 | QUIESC_REQ | Input | N/A | |
| 258 | CKSTP_IN | Input | 423 | |
| 260 | SYS_QUIESC | Input | N/A | |
| 262 | INT | Input | 233 | |
| 264 | SRESET | Input | 234 | |
| 271 | BCLK_EN | Input | 204 | |
| 273 | RTC | Input | N/A | |
| 275 | ESP_EN | Input | N/A | |
| 277 | RESUME | Input | N/A | |
| 279 | HRESET | Input | N/A | |
| 282 | 2X_PCLK | Input | N/A | |
| 285 | PCLK_EN | Input | N/A | |
| 288 | TST5 | Input | N/A | |
| 290 | TA | Input | 183 | |
| 291 | TEA | Input | 185 | Inverted |
| 292 | DRTRY | Input | 180 | |
| 295 | AACK | Input | 174 | |
| 297 | DBWO | Input | 179 | |
| 298 | BG | Input | 176 | |
| 299 | BSCAN_EN | Input | N/A | |
| 300 | DBG | Input | 178 | |
| 302 | TST12 | Input | N/A | |
| 303 | TST18 | Input | N/A | |
| 304 | TST10 | Input | N/A | |
| N/A | JTAGEN | Internal | 420 | |

I claim:

1. Apparatus for testing a microprocessor chip via scan strings having dedicated and non-dedicated sub-scan test pattern strings using a compatible Joint Task Action Group 1149.1 (JTAG) terminal comprising:

a) a plurality of computer functional units contained in the chip for operational or design verification testing through the compatible JTAG terminal;

b) the compatible JTAG terminal including a test input terminal for receiving the scan string and coupled to each computer functional unit through a first multiplexer;

c) the compatible JTAG terminal further including a test output terminal coupled to each computer functional unit through a second multiplexer;

d) an instruction register contained in the compatible JTAG terminal for receiving address bits defining the targeted computer functional unit for testing and providing signals to the first multiplexer for routing dedicated sub-scan test pattern strings to the test output terminal;

e) means under control of a programmable options register for supplying a dedicated sub-scan test pattern string to each computer functional unit from the first multiplexer; and f) means for providing test results as a scan train at the test output terminal for a targeted computer functional unit from the dedicated sub-scan test pattern string while the non-dedicated sub-scan test pattern strings for non-targeted computer functional units remain in an inactive state.

2. The apparatus of claim 1 further including scan clock logic for controlling master and slave scan clocks contained in each computer functional unit for activating the computer functional unit to receive a dedicated sub-scan test pattern string.

3. The apparatus of claim 2 further including means in the JTAG terminal for loading the programmable options register with control bits to limit a dedicated sub-scan test pattern string to a targeted computer functional unit.

4. The apparatus of claim 3 further including means in the compatible JTAG terminal for non-destructive reading of scan strings as read data from a functional unit, the read data recirculated through the first multiplexer and fed back to the computer functional units as the scan string having dedicated and non-dedicated test Patterns.

5. In an apparatus for testing a microprocessor chip via scan strings having dedicated and non-dedicated test pattern sub-scan strings using a compatible Joint Task Action Group (JTAG) 1149.1 terminal, a method for improving test operation by minimizing voltage fluctuations in the computer functional units; reducing scan time and saving memory space for storing test results, comprising the steps of:

a) supplying a scan string to a compatible JTAG terminal having a test input terminal coupled to each computer functional unit in the microprocessor chip through a first multiplexer and a test output terminal coupled to each computer functional unit through a second multiplexer;

b) loading an instruction register contained in the compatible JTAG terminal for receiving address bits defining the targeted computer functional unit for testing and providing signals to the first multiplexer for routing dedicated sub-scan test pattern strings to the test output terminal;

c) loading a programmable options register in the compatible JTAG terminal with signals for controlling the first multiplexer and scan control logic;

d) activating scan clocks contained in a targeted computer functional unit and responsive to the scan control logic to receive a dedicated sub-scan test pattern string in the targeted computer functional unit from the first multiplexer for test purposes;

e) deactivating scan clocks in all non-targeted computer functional units; and f) providing test results at the test output terminal for the targeted computer functional unit from the dedicated sub-scan test pattern string while a non-dedicated sub-scan test pattern string for non-targeted computer functional units remain in an inactive state.

6. The method of claim 5 further including the step of loading the programmable option register in the compatible JTAG terminal with control bits to identify the targeted computer functional unit for receiving a dedicated sub-scan test pattern string for test or design verification purposes.

7. A compatible Joint Test Action Group 1149.1 (JTAG) port for a microprocessor chip comprising:

a) an input terminal for receiving a scan test train for testing computer functional units contained in the chip;

b) a first multiplexer responsive to signals contained in an instruction register and an option register for separating and distributing the scan test train into dedicated and non-dedicated sub-scan test pattern trains for each computer functional unit contained in the chip;

c) clock means included in each computer functional unit responsive to clock signals contained in the option register for testing of a computer functional unit using the dedicated sub-scan test pattern train for the respective computer functional unit;

d) a second multiplexer for collecting the dedicated sub-scan test pattern trains for each computer functional unit under control of the signals in the instruction and option registers and forming a single output scan train as an output at an output terminal; and e) means for returning the output scan train to the first multiplexer and/or an output device.

8. An article of manufacture in a computer usable medium having computer programs embodied therein for improved testing of a microprocessor chip including computer functional units by minimizing voltage fluctuations in the computer functional units; reducing scan time and saving memory space for storing test results, said article of manufacture comprising:

a) first computer program code means using an instruction register and an options register for supplying a scan string having dedicated and non-dedicated test pattern sub-strings to a compatible JTAG 1149.1 terminal having a test input terminal coupled to each computer functional unit in the microprocessor chip through a first multiplexer and a test output terminal coupled to each computer functional unit through a second multiplexer;

b) second computer program code means for activating scan clocks contained in a targeted computer functional unit to receive a dedicated sub-scan test pattern string from the first multiplexer for test purposes;

c) third computer program code means for deactivating scan clocks in all non-targeted computer functional units; and d) fourth computer programs code means for providing test results at the test output terminal for the targeted computer functional unit from the dedicated sub-scan test pattern string while the non-dedicated sub-scan strings for non-targeted computer functional units remain in an inactive state.

9. Apparatus for testing a microprocessor chip via scan strings having dedicated and non-dedicated test pattern sub-scan strings generated by a test system using an input port coupled to a test system, comprising:

a) a plurality of computer functional units contained in the chip for operational or design verification testing through the input port;

b) the input port including a test input terminal for receiving the scan string from the test system and coupled to each computer functional unit through a first multiplexer;

c) the input port further including a test output terminal coupled to each computer functional unit through a second multiplexer;

d) means under control of an instructions register and a programmable options register for supplying dedicated and non-dedicated sub-scan test pattern string to each computer functional unit through the first multiplexer;

(e) scan clock logic for controlling master and slave scan clocks contained in each computer functional unit for activating such unit to receive a dedicated sub-scan test pattern string; and e) means for providing test results as a scan train at the test output terminal to the test system or the first multiplexer for the targeted computer functional unit from the dedicated sub-scan test pattern string while the non-dedicated sub-scan test pattern strings for non-targeted computer functional units remain in an inactive state.

10. In an apparatus for testing a microprocessor chip via scan strings having dedicated and non-dedicated sub-scan test pattern strings generated by a test system coupled to an input port, a method for testing the microprocessor chip for operational or design verification testing, comprising the steps of:

a) supplying a scan string from the test system to the input port having a test input terminal coupled to each computer functional unit in the microprocessor chip through a first multiplexer and a test output terminal coupled to each computer functional unit through a second multiplexer;

b) loading an instructions register and a programmable options register in the input port with signals from the test processor for controlling the first multiplexer and scan control logic;

c) activating scan clocks contained in a targeted computer functional unit and responsive to the scan control logic to enable a dedicated sub-scan test pattern string from the first multiplexer to be supplied to the targeted computer functional unit for test purposes;

d) deactivating scan clocks in all non-targeted computer functional units; and e) providing test results at the test output terminal for the targeted computer functional unit from the dedicated sub-scan test pattern string while the sub-scan strings for non-targeted computer functional units remain in an inactive state.

* * * * *